United States Patent
Fink et al.

(10) Patent No.: US 9,291,685 B2
(45) Date of Patent: Mar. 22, 2016

(54) DEVICE FOR EVALUATING A MAGNETIC FIELD

(71) Applicant: Micronas GmbH, Freiburg (DE)

(72) Inventors: Hans Joerg Fink, Freiburg (DE); Martin Bayer, Voerstetten (DE)

(73) Assignee: Micronas GmbH, Freiburg (DE)

( * ) Notice: Subject to any disclaimer, the term of this patent is extended or adjusted under 35 U.S.C. 154(b) by 412 days.

(21) Appl. No.: 13/933,593

(22) Filed: Jul. 2, 2013

(65) Prior Publication Data
US 2014/0002073 A1   Jan. 2, 2014

Related U.S. Application Data

(60) Provisional application No. 61/667,734, filed on Jul. 3, 2012.

(30) Foreign Application Priority Data
Jul. 2, 2012  (DE) .......................... 10 2012 013 072

(51) Int. Cl.
*G01R 33/00* (2006.01)
*G01R 33/07* (2006.01)

(52) U.S. Cl.
CPC ............ *G01R 33/0023* (2013.01); *G01R 33/07* (2013.01)

(58) Field of Classification Search
CPC ....... G01D 5/145; G01D 5/147; G01D 5/247; G01D 5/00; G01R 33/02; G01R 33/09; G01R 33/093; G01R 33/025; G01R 33/022; G01R 33/0385; G01B 7/003; G01P 3/487; G01P 3/443; B60L 13/06; B60L 2200/26; H04L 12/2697; H04L 43/50

USPC .......... 324/244, 207.21, 207.22, 207.11, 219, 324/220
See application file for complete search history.

(56) References Cited

U.S. PATENT DOCUMENTS

| | | | |
|---|---|---|---|
| 6,424,143 B1 * | 7/2002 | Blossfeld ................. | G01D 3/08 324/160 |
| 6,937,051 B2 | 8/2005 | Eichin et al. | |
| 6,968,484 B2 | 11/2005 | Hummel | |
| 7,231,325 B2 * | 6/2007 | Motz .................... | G01D 5/2448 324/200 |
| 7,319,418 B2 | 1/2008 | Fink | |

(Continued)

FOREIGN PATENT DOCUMENTS

| | | | |
|---|---|---|---|
| DE | 10 2005 014 133 B3 | 6/2006 | |
| DE | 10 2006 044 901 A1 | 4/2008 | |

(Continued)

*Primary Examiner* — Tung X Nguyen
*Assistant Examiner* — Thang Le
(74) *Attorney, Agent, or Firm* — Muncy, Geissler, Olds & Lowe, P.C.

(57) ABSTRACT

A device for evaluating a magnetic field with an integrated circuit with a magnetic field sensor is provided, which has a first connection, a second connection, and a third connection led out from the housing. A signal conditioning circuit is connected to the magnetic field sensor. A control circuit generates a control signal for controlling the signal conditioning circuit based on a detected transmission signal with a detection circuit for detecting the transmission signal. The signal conditioning circuit generates an analog signal based on a sensor signal and based on the control signal. An evaluation circuit evaluates the analog signal and compares the analog signal to a default value to adjust the signal conditioning circuit via the digital transmission signal such that the analog signal corresponds to the default value.

7 Claims, 2 Drawing Sheets

(56) References Cited

U.S. PATENT DOCUMENTS

| | | |
|---|---|---|
| 7,586,430 B2 | 9/2009 | Engl |
| 7,761,756 B2 | 7/2010 | Bidenbach et al. |
| 7,994,782 B2 * | 8/2011 | Takeda .................. G01R 33/07 324/244 |
| 2006/0167644 A1 * | 7/2006 | Muller ................. G01D 18/008 700/88 |
| 2008/0278891 A1 | 11/2008 | Bidenbach et al. |
| 2009/0252210 A1 | 10/2009 | Rubehn et al. |
| 2011/0204888 A1 * | 8/2011 | Han ..................... G01R 33/072 324/251 |
| 2012/0136606 A1 * | 5/2012 | Stephanson ............ G01R 33/10 702/104 |

FOREIGN PATENT DOCUMENTS

| | | |
|---|---|---|
| EP | 0 953 848 B1 | 7/2004 |
| EP | 1 855 089 A2 | 11/2007 |
| EP | 1 857 827 A2 | 11/2007 |
| EP | 1 575 013 B1 | 2/2010 |
| EP | 1 217 630 B1 | 3/2010 |
| EP | 2 105 750 B1 | 1/2011 |

* cited by examiner

DEVICE FOR EVALUATING A MAGNETIC FIELD

This nonprovisional application claims priority to German Patent Application No DE 10 2012 013 072.4, which was filed in Germany on Jul. 2, 2012, and to U.S. Provisional Application No. 61/667,734, which was filed on Jul. 3, 2012, and which are both herein incorporated by reference.

BACKGROUND OF THE INVENTION

1. Field of the Invention

The invention relates to a device for evaluating a magnetic field.

2. Description of the Background Art

An integrated circuit with a bidirectional mixed signal single wire interface is known from DE 10 2005 014 133 B3, which corresponds to U.S. Pat. No. 7,586,430. Via the mixed signal single wire interface the integrated circuit can receive command information from a host and can send conditioned analog signals to the host. The integrated circuit has means for analog signal conditioning, for command detection, and for digital control. For the command detection, current detectors are used that respond to the current flowing through the interface connection, so that commands can be given even when analog signals are applied to the bus. The host is a microcontroller with an analog/digital converter. Sensors can be connected via raw signal inputs or can be situated on the integrated circuit itself. In an analog signal conditioning mode, the analog signal conditioning means is embodied to amplify and/or to filter an analog signal that comes from a sensor situated on the chip itself. In the analog signal conditioning mode, the analog signal conditioning means drive the conditioned analog signal via a connection to the bidirectional mixed signal single wire interface line.

A method for testing an integrated circuit is known from EP 1 217 630 B1, which corresponds to U.S. Pat. No. 6,937,051. A sensor with multiplex data output is known from EP 1 575 013 B1, which corresponds to U.S. Pat. No. 7,319,418, and which is incorporated herein by reference. A method for the parameter assignment of an integrated circuit configuration and an integrated circuit configuration is known from EP 0 953 848 B1, which corresponds to U.S. Pat. No. 6,968,484, which is incorporated herein by reference. A circuit configuration and a method for the serial transmission of data via a terminal contact is known from EP 2 105 750 B1, which corresponds to US 20090252210, which is incorporated herein by reference. A circuit configuration with a serial test interface and a serial testing mode method is known from EP 1 855 089 A2 and EP 1 857 827 A2, which corresponds to US 20080278891 and U.S. Pat. No. 7,761,756, respectively, and which are incorporated herein by reference.

SUMMARY OF THE INVENTION

It is therefore an object of the present invention to provide a device for evaluating a magnetic field.

In an embodiment, the device includes an integrated circuit that has a first connection led out from a housing and a second connection led out from the housing and a third connection led out from the housing. Preferably the integrated circuit has precisely the first, second, and third connection.

The integrated circuit can have a magnetic field sensor that is connected to the second connection and the third connection for the power supply.

The integrated circuit can have a signal conditioning circuit connected to the magnetic field sensor.

The integrated circuit can have a detection circuit for detecting a digital transmission signal applied to the first connection.

The integrated circuit can have a control circuit for controlling the signal conditioning circuit by means of a control signal.

To produce the control signal, based on the detected transmission signal the control circuit can be connected to the detection circuit.

The signal conditioning circuit can be embodied for the production of an analog signal based on a sensor signal of the magnetic field sensor and based on the control signal of the control circuit.

The signal conditioning circuit can be connected to the first connection for the output of the analog signal.

The device includes an evaluation circuit. The evaluation circuit can be connected to the integrated circuit for evaluating the analog signal.

The device includes a transmission circuit controllable by means of the evaluation circuit. The transmission circuit can be connected to the first connection of the integrated circuit for the transmission of the digital transmission signal.

The evaluation circuit can be set up to compare the analog signal with a default value and to set the signal conditioning circuit by means of the digital transmission signal in such a way that the analog signal corresponds to the default value.

An advantage of a concrete conversion of the device according to an embodiment of the invention is that no digital signal coding is needed for the digital transmission signal. Research by the applicant has shown that through the evaluation by means of the evaluation circuit, a reliable setting of parameters of the signal conditioning circuit is possible.

According to a further embodiment, it is provided that the control circuit for producing the control signal has a finite automatic device, for example, a counter. The signal conditioning circuit can be set up, based on a change of a condition of the automatic device, i.e. in particular of a count value of the counter, to change the analog signal. Through the use of the finite automatic device, the parameters and the evaluation can be set up by means of the evaluation circuit in a particularly simple and reliable manner.

In an embodiment, the signal conditioning circuit can be set up to change a gain e.g. of an amplifier and/or of a limit frequency e.g. of a filter.

According to an embodiment, the signal conditioning circuit can be set up to output a voltage value of the analog signal, e.g. an offset voltage in the operating point of an amplifier, or a current value of the analog signal, e.g. an offset current in the operating point of an amplifier, associated with a gain and/or a limit frequency. By these means a particularly simple determination of the respective current parameter value can result by means of the evaluation circuit.

The signal conditioning circuit can be set up for the output of the analog signal during the transmission of the digital transmission signal. Preferably the evaluation circuit is set up to control the transmission circuit during the evaluation of the analog signal. Both enable an evaluation of the magnetic field to be possible also during the setting up of the signal conditioning circuit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
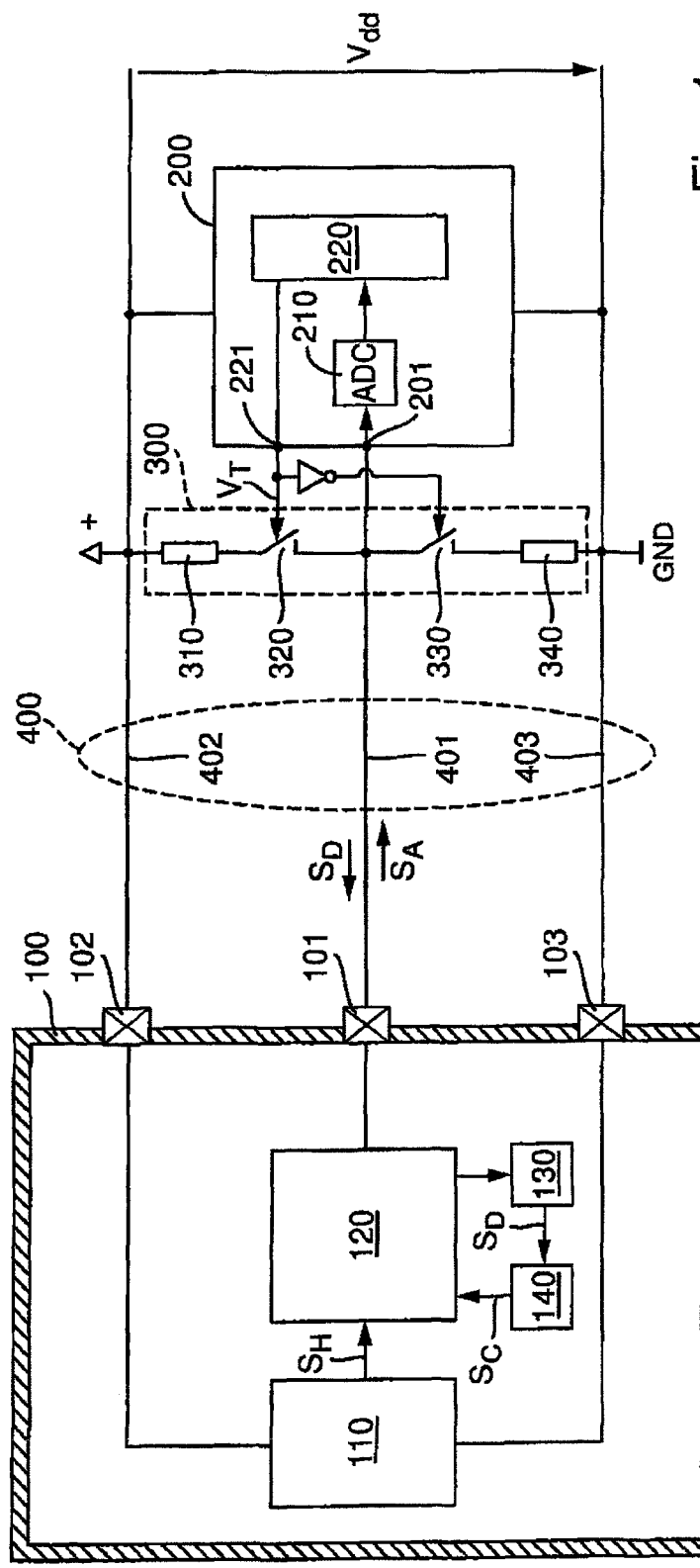
FIG. 1 shows a schematic block diagram of a form of embodiment of a device according to the invention.

The illustration of FIG. 1 shows a block diagram of a form of embodiment having a device for evaluating a magnetic field. The device has an integrated circuit that is arranged in a housing 100. The integrated circuit has a Hall sensor 110 as a magnetic field sensor and a signal conditioning circuit 120 and a detection circuit 130 and a control circuit 140, which are embodied together in a semiconductor chip. The integrated circuit in addition has a first connection 101 led out from the housing 100 and a second connection 102 led out from the housing 100 and a third connection 103 led out from the housing 100. The connections 101, 102, 103 can be embodied, for example, as metallic pins. The integrated circuit is connected via the connections to conductors 401, 402, 403 of a line link 400. The line link 400 is formed, for example, by means of a three-core cable or circuit-board conductors on a printed circuit board. A particular advantage of the form of embodiment of FIG. 1 thereby is that only three connections 101, 102, 103 are needed, which enable reduced production costs. However, both an output of an analog signal $S_A$ and the setting up of the integrated circuit by means of a digital transmission signal $S_D$ are possible.

The integrated circuit has as the Hall sensor 110, a magnetic field sensor, which for the power supply is connected to the second connection 102 and the third connection 103. The supply voltage Vdd is applied via the second connection 102 and the third connection 103. The individual circuits 120, 130, 140 can also be supplied by means of the supply voltage.

The signal conditioning circuit 120 is connected to the Hall sensor 110, in order to condition the Hall signal $S_H$ of the Hall sensor 110, for example, by filtering and/or gain and to output the conditioned Hall signal $S_H$ as analog signal $S_A$ at the first connection 101.

The detection circuit 130 of the integrated circuit is adapted for the detection of a digital transmission signal $S_D$ applied to the first connection 101. The detection circuit 130 has for example a current comparator for the detection of a current signal as digital transmission signal $S_D$ or a voltage comparator for the detection of a voltage signal as digital transmission signal $S_D$.

The control circuit 140 is embodied for the control of the signal conditioning circuit 120 by means of a control signal $S_C$. The control circuit 140 is thereby set up for the production of the control signal $S_C$ based on the detected transmission signal $S_D$ and for this purpose is connected to the detection circuit 130. In the form of embodiment of FIG. 1, the control circuit 140 has a finite automatic device. The finite automatic device is for example a counter and counts for example impulses of a clock of the integrated circuit as long as the transmission signal $S_D$ is applied. Alternatively it is possible for the counter to count every feed of the transmission signal $S_D$. In both cases the value output by the finite automatic device, in particular the count value output from the counter, is output as control signal $S_C$ at the signal conditioning circuit 120. Through the use of a counter, in the form of embodiment of FIG. 1 a particularly simple and reliable circuit is achieved. The triggering of the counter by means of the digital transmission signal $S_D$ is also very simple, so that no complex bus protocols are needed.

The signal conditioning circuit 120 produces the analog signal $S_A$ based on the sensor signal $S_H$ of the Hall sensor 110 and based on the control signal $S_C$ of the control circuit 140. For example by means of the control signal $S_C$ a gain and/or a limit frequency of the signal conditioning circuit 120 can be set up, wherein the signal conditioning circuit 120 for this purpose has for example an analog amplifier and/or an analog filter. For the output of the analog signal $S_A$, the signal conditioning circuit 120 is connected to the first connection 101.

An evaluation circuit 200 is shown that is connected to the integrated circuit via the line link 400. The evaluation circuit 200 has an analog-to-digital converter 210, which is connected via the input 201 to the first connection 101 of the integrated circuit. The evaluation circuit 200 is thereby set up for the evaluation of the analog signal $S_A$ also by means of digital data processing. For this purpose the evaluation circuit 200 has an arithmetic unit 220 that outputs the signal $V_T$ for controlling a transmission circuit 300 via the output 221. The evaluation circuit 200 is integrated together with the transmission circuit 300 for example on a semiconductor chip, for example as a microcontroller or as an application-specific integrated circuit (ASIC). In the form of embodiment of FIG. 1, the transmission circuit 300 is controllable by means of the evaluation circuit 200, in order to transmit the transmission signal $S_D$ to the integrated circuit. For this purpose the transmission circuit 300 is connected to the first connection 101 of the integrated circuit 100.

The transmission circuit 300 has two semiconductor switches 320, 330 and two resistors 340 and 310, wherein by means of the switches 320, 330 a pull-up resistor 310 or a pull-down resistor 340 can be switched. If the pull-up resistor 310 is switched, the first connection 101 is switched to the potential+via the pull-up resistor 310 and the current flows into the integrated circuit through the first connection 101. If on the other hand the pull-down resistor 340 is switched, the first connection 101 is switched to ground GND via the pull-down resistor 340 and the current flows out of the integrated circuit through the first connection. The current direction acts as a digital transmission signal $S_D$ and can be detected for example by means of a current detector. On the other hand the signal conditioning circuit 120 drives an analog output voltage as analog signal $S_A$ essentially independent of the current direction.

The device of FIG. 1 has a method of functioning as detailed below. The evaluation circuit 200 evaluates the analog signal $S_A$. For this, the evaluation circuit 200 determines, for example, the amplitude of the analog signal $S_A$ or the average of the analog signal $S_A$. The evaluation circuit 200 is set up to compare the analog signal $S_A$ with a default value—such as for example a default amplitude value or a default average value. The evaluation circuit 200 is furthermore set up, based on the comparison, to set the signal conditioning circuit 120 such that the analog signal $S_A$ corresponds to the default value. The setting then takes place by means of the digital transmission signal $S_D$ with the aid of the detection circuit 130 and the control circuit 140, as described above. If for example the gain through the signal conditioning circuit 120 is too low, the evaluation circuit 200 can recognize a too low amplitude of the analog signal and raise it in particular stepwise by adjusting the signal conditioning circuit 120.

The signal conditioning circuit 120 and the evaluation circuit 200 and the transmission circuit 300 and the detection circuit 130 and the control circuit 140 form a circuit for adjusting the signal conditioning circuit 120.

Figure 2:
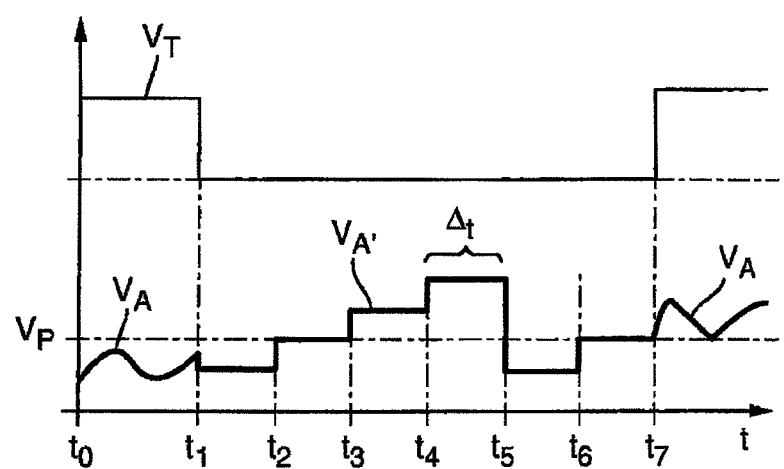
FIG. 2 shows a schematic signal diagram.

In the representation of FIG. 2 a diagram is shown with signals $V_T$, $V_A$, VA' over the time t. A course of the analog signal $S_A$ is shown between the times t0 and t1 as an analog voltage $V_A$. The analog voltage $V_A$ is produced thereby from the Hall signal $S_H$ from the signal conditioning circuit 120 according to FIG. 1.

At the time t1 the digital transmission signal $S_D$ is produced by the evaluation circuit 200 according to FIG. 1 and is transmitted to the integrated circuit. The course of the control voltage $V_T$ is shown, by means of which the evaluation circuit 200 controls the transmission circuit 300. Thereby at the time t1 the pull-up resistance 310 is switched to the pull-down resistance 340. The change in the current direction through the first connection 101 is detected by the detection circuit 130 and the counter of the control circuit 140 is started. At the same time, at the time t1 the Hall signal $S_H$ is separated and a voltage offset is output at the first connection 101 as an analog voltage $V_A'$, which offset is dependent on the count value.

The analog voltage $V_A'$ rises at the first connection 101 with each count step in the time interval Δt. Alternatively the analog voltage $V_A'$ could fall at the first connection 101 with each count step. The analog voltage $V_A'$ rises at the times t2, t3 and t4 and reaches a maximum at time t4. With the next count value at time t5 the analog voltage $V_A'$ drops back to the output value at the first connection 101. The evaluation circuit 200 evaluates the analog voltage $V_A'$ for each count value and determines the voltage $V_P$ of the second count value as a default value.

The analog voltage $V_A'$ is subsequently compared with the determined default value $V_P$, wherein the analog voltage $V_A'$ in the embodiment of FIG. 2 corresponds to the default value $V_P$ at the time t6, which is determined by the evaluation circuit 200. Shortly thereafter, in accordance with the control voltage $V_T$, the pull-down resistor 340 is switched to the pull-up resistor 310 at the time t7, which is detected by the detection circuit 130. At the time t7 the counter is stopped at its current count value and the Hall signal $S_H$ is output for example with a new gain factor conditioned as analog voltage $V_A$.

The invention is not restricted thereby to the forms of the embodiment shown in FIGS. 1 and 2. For example, it is possible to change several different parameters for the signal conditioning in succession by means of the counter. Likewise a different number of count steps can be provided.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device for evaluating a magnetic field, the device comprising:
    an integrated circuit that has a first connection led out from a housing, a second connection led out from the housing, and a third connection led out from the housing, the integrated circuit comprising:
        a magnetic field sensor that is connected to the second connection and the third connection for power supply;
        a signal conditioning circuit connected to the magnetic field sensor;
        a detection circuit configured to detect a digital transmission signal applied to the first connection; and
        a control circuit configured to control the signal conditioning circuit via a control signal, the control circuit being connected to the detection circuit for generating the control signal based on the digital transmission signal,
    wherein the signal conditioning circuit is adapted to generate an analog signal based on a sensor signal from the magnetic field sensor and based on the control signal of the control circuit,
    wherein the signal conditioning circuit is connected to the first connection for the output of the analog signal, and
    wherein an evaluation circuit is connected to the integrated circuit to evaluate the analog signal; and
    a transmission circuit that is adapted to be controllable by the evaluation circuit, the transmission circuit being connected to the first connection of the integrated circuit for transmitting the digital transmission signal,
    wherein the evaluation circuit is configured to compare the analog signal with a default value and configured to set the signal conditioning circuit via the digital transmission signal such that the analog signal corresponds to the default value.

2. The device according to claim 1, wherein the control circuit has a finite automatic device for the production of the control signal, and wherein the signal conditioning circuit is configured to change the analog signal based on a change in state of the finite automatic device.

3. The device according to claim 2, wherein the finite automatic device has a counter for generating the control signal, and wherein the signal conditioning circuit is configured to change the analog signal based on a change of a count value of the counter.

4. The device according to claim 1, wherein the signal conditioning circuit is configured to change a gain and/or a limit frequency.

5. The device according to claim 1, wherein the signal conditioning circuit is configured to output a voltage value or a current value of the analog signal associated with a gain and/or a limit frequency.

6. The device according to claim 1, wherein the signal conditioning circuit is configured to output the analog signal during the transmission of the digital transmission signal, and wherein the evaluation circuit is configured to control the transmission circuit during the evaluation of the analog signal.

7. The device according to claim 1, wherein the magnetic field sensor is a hall sensor.

* * * * *